(12) United States Patent
Kim et al.

(10) Patent No.: US 12,365,190 B2
(45) Date of Patent: Jul. 22, 2025

(54) APPARATUS AND METHOD FOR FORMING A RESIST FINE PATTERN

(71) Applicant: UNIJET CO., LTD., Gyeonggi-do (KR)

(72) Inventors: Seog-soon Kim, Gyeonggi-do (KR); Jong-gyun Lee, Gyeonggi-do (KR); Hee-jun Han, Gyeonggi-do (KR)

(73) Assignee: UNIJET CO., LTD., Gyeonggi-Do (KR)

( * ) Notice: Subject to any disclaimer, the term of this patent is extended or adjusted under 35 U.S.C. 154(b) by 89 days.

(21) Appl. No.: 17/924,739

(22) PCT Filed: Feb. 3, 2021

(86) PCT No.: PCT/KR2021/001409
§ 371 (c)(1),
(2) Date: Nov. 11, 2022

(87) PCT Pub. No.: WO2021/230468
PCT Pub. Date: Nov. 18, 2021

(65) Prior Publication Data
US 2023/0182488 A1 Jun. 15, 2023

(30) Foreign Application Priority Data

May 11, 2020 (KR) .................. 10-2020-0056065

(51) Int. Cl.
*B41J 11/00* (2006.01)
*G03F 7/16* (2006.01)
(Continued)

(52) U.S. Cl.
CPC ........... *B41J 11/00212* (2021.01); *G03F 7/16* (2013.01); *H05K 3/061* (2013.01); *H05K 3/064* (2013.01);
(Continued)

(58) Field of Classification Search
CPC ................ B41J 11/00212; G03F 7/16; H05K 2203/013; H05K 2203/0568;
(Continued)

(56) References Cited

U.S. PATENT DOCUMENTS

2002/0039624 A1\* 4/2002 Yabe ....................... H01J 9/242
118/620
2006/0040435 A1 2/2006 Morisue et al.
(Continued)

FOREIGN PATENT DOCUMENTS

JP 2003-318133 A 11/2003
JP 2006-196753 A 7/2006
(Continued)

OTHER PUBLICATIONS

European Search Report For EP21805029.2 issued on Jul. 9, 2024 from European patent office in a counterpart European patent application.
(Continued)

*Primary Examiner* — Henok D Legesse
(74) *Attorney, Agent, or Firm* — The PL Law Group, PLLC

(57) ABSTRACT

A method for forming a resist fine pattern uses inkjet printing for printing an ink along a path to form a resist fine pattern on a substrate having the same surface energy. The method includes an ejecting step of simultaneously discharging a photocurable resist ink and a partition-forming ink that are spaced from each other on the front side and the rear side of the path and applying the light energy to the discharged photocurable resist ink. The intensity of light is set so that, as the photocurable resist ink is semi-cured and is ejected on the substrate in a gelatinous state, the ink forms a boundary that is vertical with respect to the partition-forming ink ejected on the substrate and the spreading of the
(Continued)

photocurable resist ink is prevented, and the photocurable resist ink is cured after both the photocurable resist ink and the partition-forming ink are completely ejected.

14 Claims, 8 Drawing Sheets

(51) Int. Cl.
 *H05K 3/06* (2006.01)
 *H05K 3/18* (2006.01)
(52) U.S. Cl.
 CPC ....... *H05K 3/184* (2013.01); *H05K 2203/013* (2013.01); *H05K 2203/0568* (2013.01); *H05K 2203/058* (2013.01); *H05K 2203/0582* (2013.01); *H05K 2203/0585* (2013.01); *H05K 2203/0786* (2013.01)
(58) Field of Classification Search
 CPC ..... H05K 2203/058; H05K 2203/0582; H05K 2203/0585; H05K 2203/0786; H05K 3/064; H05K 3/061; H05K 3/184
 See application file for complete search history.

(56) References Cited

U.S. PATENT DOCUMENTS

| | | | |
|---|---|---|---|
| 2007/0058021 A1* | 3/2007 | Kusunoki | ............ B41J 2/04551 347/102 |
| 2019/0355577 A1* | 11/2019 | Kim | ....................... H05K 3/125 |

FOREIGN PATENT DOCUMENTS

| | | | |
|---|---|---|---|
| JP | 2014-172313 | A | 9/2014 |
| KR | 10-2002-0027175 | A | 4/2002 |
| KR | 10-2008-0037306 | A | 4/2008 |
| KR | 10-2019-0131189 | A | 11/2019 |

OTHER PUBLICATIONS

International Search Report for PCT/KR2021/001409 mailed on May 24, 2021.
Office action issued on May 24, 2021 from Korean Patent Office in a counterpart Korean Patent Application No. 10-2020-0056065 (all the cited references are listed in this IDS.) (English translation is also submitted herewith.).

* cited by examiner

FIG. 1
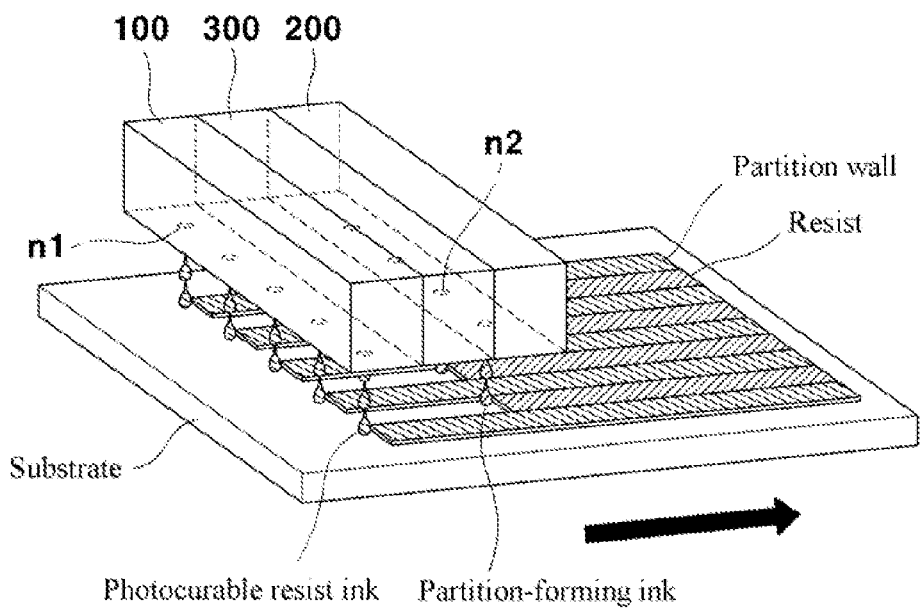
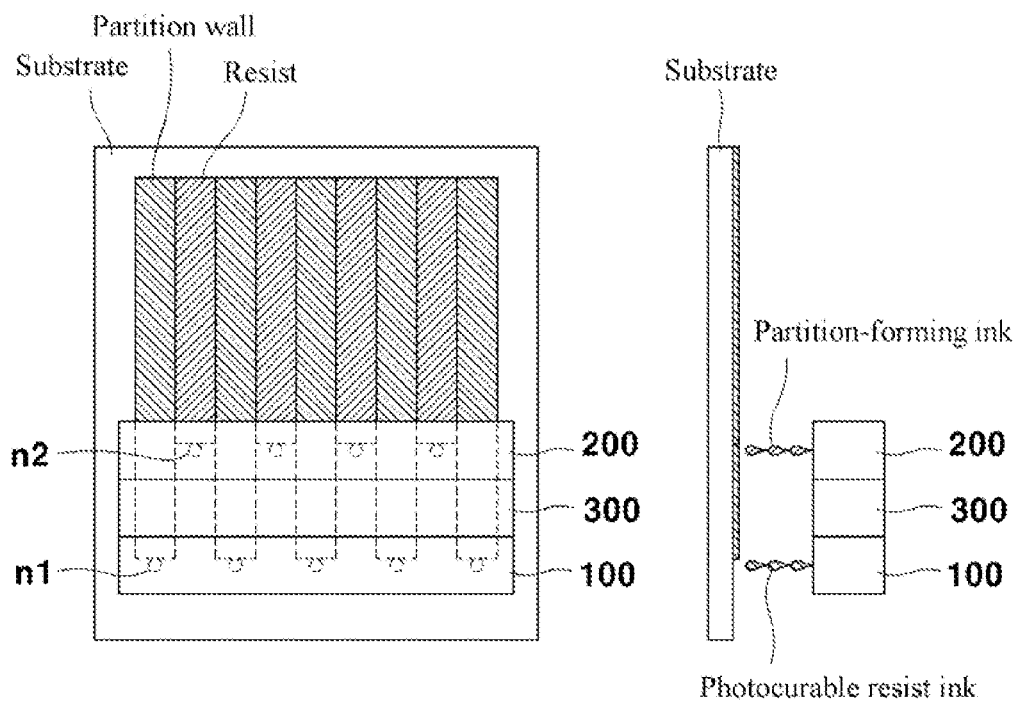

APPARATUS AND METHOD FOR FORMING A RESIST FINE PATTERN

GOVERNMENT LICENSE RIGHTS

The present invention was supported by the national research and development program (Project identification number: 1415178608; Project number: 20010022; Department name: Ministry of Trade, Industry and Energy; Project management (professional) organization name: Korea Institute of Industrial Technology Evaluation and Planning; Research program title: Next-generation hybrid PCB technology development (R&D); Research project title: Development of ultra-high multilayer PCB board for high-speed signal transmission with 30-class line width applied with printed electronics method; Contribution ratio: 1/1; Project execution organization name: ATC Co., Ltd.; Research period: 2020.04.01-2023.12.31) awarded by Ministry of Trade, Industry and Energy. The Government has certain rights in the invention.

CROSS REFERENCE TO RELATED APPLICATIONS AND CLAIM OF PRIORITY

This application claims benefit under 35 U.S.C. 119, 120, 121, or 365(c), and is a National Stage entry from International Application No. PCT/KR2021/001409, filed Feb. 3, 2021, which claims priority to the benefit of Korean Patent Application No. 10-2020-0056065 filed in the Korean Intellectual Property Office on May 11, 2020, the entire contents of which are incorporated herein by reference.

BACKGROUND

1. Technical Field

The present invention relates to an apparatus and a method for forming a resist fine pattern, and more particularly, to an apparatus and a method for forming a resist fine pattern, which ejects a photocurable resist ink in a semi-cured and gelatinous state on a substrate and simultaneously form a resist fine pattern to form a vertical boundary with respect to a partition-forming ink, thereby forming an almost vertical edge of the formed resist fine pattern to have a sufficient thickness and forming a metal pattern with a good etching or plating result.

2. Background Art

A technology of printing an etching resist pattern using an inkjet technology is actively developed at the beginning of the year 2000 that is an early stage of development of a printed electronics technology to develop a PCB manufacturing technology using a line width of 80 μm to 150 μm.

However, the technology of forming an etching or plating resist pattern using an inkjet printing method is not commercialized yet despite of many advantages.

This is because of expensive equipment and process costs and low productivity in comparison with a screen printing technology that is most widely used in current PCB manufacturing, and realization of the resist pattern having a great thickness, which is generally required in PCB, is extremely difficult.

Particularly, an edge in a width direction of the etching or plating resist pattern printed by the inkjet printing method has a small contact angle of an ink droplet due to spreading of an ink. Thus, as the edge in the width direction of the resist pattern is rounded, the edge in the width direction of the resist pattern, as an etching prevention portion, does not effectively prevent a portion therebelow from being etched during an etching process not to obtain a metal pattern with a good etching result.

Likewise, the edge in the width direction of the resist pattern, as a plating prevention portion, does not effectively prevent a portion therebelow from being plated during a plating process not to obtain a metal pattern with a good plating result.

In order to resolve the above-described limitations, a method of increasing the contact angle of the ink droplet that forms the resist pattern by controlling a position of an ink such that the ink is gathered into only a specific area by performing a hydrophobic treatment on a surface of a substrate, or the ink is gathered toward a lower side by forming a stepped portion on the surface of the substrate has been attempted.

However, this method has a disadvantage in that a surface treatment of the substrate to have a hydrophobic or hydrophilic property or a process of forming the stepped portion causes high manufacturing costs, and a cross-sectional edge of the pattern still has a curved shape. Thus, the method still may not obtain the metal pattern with a good etching result.

SUMMARY

The present invention provides an apparatus and a method for forming a resist fine pattern, which forms a resist fine pattern to form a vertical boundary with respect to a partition-forming ink at the same time when a photocurable resist ink in a semi-cured and gelatinous state is ejected on a substrate and form an almost vertical edge of the resist fine pattern to have a sufficient thickness, thereby forming a metal pattern with a good etching or plating result.

In order to achieve the technical objects, the present invention provides a method for forming a resist fine pattern, which forms a resist fine pattern on a substrate having the same surface energy by using an inkjet printing method of printing an ink along a path, including an ejecting process of, while simultaneously discharging a photocurable resist ink at a front side of the path and a partition-forming ink at a rear side of the path to be spaced apart from each other, applying optical energy to the discharged photocurable resist ink. Here, an intensity of light of the optical energy is set so that the photocurable resist ink in a semi-cured and gelatinous state is ejected on the substrate to form a vertical boundary with the partition-forming ink ejected on the substrate and simultaneously prevent the photocurable resist ink from being spread, thereby being cured after all of the photocurable resist ink and the partition-forming ink are completely ejected.

In an embodiment, one of the photocurable resist ink and the partition-forming ink may be discharged at the front side of the path, and the other thereof may be discharged at the rear side of the path.

In an embodiment, the method may further include a curing process of additionally curing the photocurable resist ink after the ejecting process.

In an embodiment, the ejecting process may be performed at least two times to thicken a thickness of the resist fine pattern.

In an embodiment, the photocurable resist ink may be discharged through a plurality of nozzles of a first discharge head, which are arranged in a direction perpendicular to the path, the partition-forming ink may be discharged through a plurality of nozzles of a second discharge head, which are arranged in a direction perpendicular to the path, and the plurality of nozzles of the first discharge head and the plurality of nozzles of the second discharge head may be alternately arranged based on the path.

In an embodiment, the plurality of nozzles of the first discharge head and the plurality of nozzles of the second discharge head may be alternately arranged so that an outermost nozzle of the second discharge head is disposed at an inner side of an outmost nozzle of the first discharge head.

In an embodiment, the first discharge head and the second discharge head may have the same width that covers an entire width of the substrate and be arranged in series in front and rear directions of the path.

In an embodiment, the partition-forming ink may be removable by cleaning with water.

In an embodiment, the method may further include: after the ejecting process, a cleaning process of removing the partition-forming ink by cleaning with water; and an etching process of etching an area of the substrate except for a resist made of the photocurable resist ink, which is remained after the cleaning process.

In an embodiment, the method may further include: after the ejecting process, a cleaning process of removing the partition-forming ink by cleaning with water; a hydrophilic treatment process of performing hydrophilic treatment on a resist made of the photocurable resist ink, which is remained after the cleaning process; and a plating process of forming a plating pattern on an area of the substrate except for the resist.

In order to achieve the technical objects, the present invention provides an apparatus for forming a resist fine pattern, which forms a resist fine pattern on a substrate having the same surface energy by using an inkjet printing method of printing an ink along a path, including: a first discharge head configured to discharge a first ink at a front side of the path; a second discharge head configured to discharge a second ink at a rear side of the path at the same time with the first discharge head; and a light irradiator configured to apply optical energy to the ink discharged from at least one of the first discharge head and the second discharge head. Here, the first ink is one of a photocurable resist ink and a partition-forming ink, and the second ink is the other thereof, and an intensity of light of the light irradiator is set so that the photocurable resist ink in a semi-cured and gelatinous state is ejected on the substrate to form a vertical boundary with the partition-forming ink ejected on the substrate and simultaneously prevent the photocurable resist ink from being spread, thereby being cured after all of the photocurable resist ink and the partition-forming ink are completely ejected.

In an embodiment, the photocurable resist ink may be discharged through a plurality of nozzles of the first discharge head, which area arranged in a direction perpendicular to the path, the partition-forming ink may be discharged through a plurality of nozzles of the second discharge head, which area arranged in a direction perpendicular to the path, and the plurality of nozzles of the first discharge head and the plurality of nozzles of the second discharge head may be alternately arranged based on the path.

In an embodiment, the plurality of nozzles of the first discharge head and the plurality of nozzles of the second discharge head may be alternately arranged so that an outermost nozzle of the second discharge head is disposed at an inner side of an outmost nozzle of the first discharge head.

In an embodiment, the first discharge head and the second discharge head may have the same width that covers an entire width of the substrate and are arranged in series in front and rear directions of the path.

The present invention may form the resist fine pattern to form the vertical boundary with respect to the partition-forming ink at the same time when the photocurable resist ink in the semi-cured and gelatinous state is ejected on the substrate and form the almost vertical edge of the resist fine pattern to have the sufficient thickness, thereby forming the metal pattern with the good etching or plating result. Also, since the more uniform line straightness is obtained as the side effects of the partition wall formation, the linear pattern may be uniformly formed with the good etching or plating result, and the less loss may be realized in the high frequency circuit, particularly 5 G millimeter wave communication.

The object of the present invention is not limited to the aforesaid, but other objects not described herein will be clearly understood by those skilled in the art from descriptions below.

BRIEF DESCRIPTION OF THE DRAWINGS

FIG. 1 is a view for explaining an ejecting process of a method for forming a resist fine pattern according to an embodiment of the present invention.

DETAILED DESCRIPTION

Figure 2:
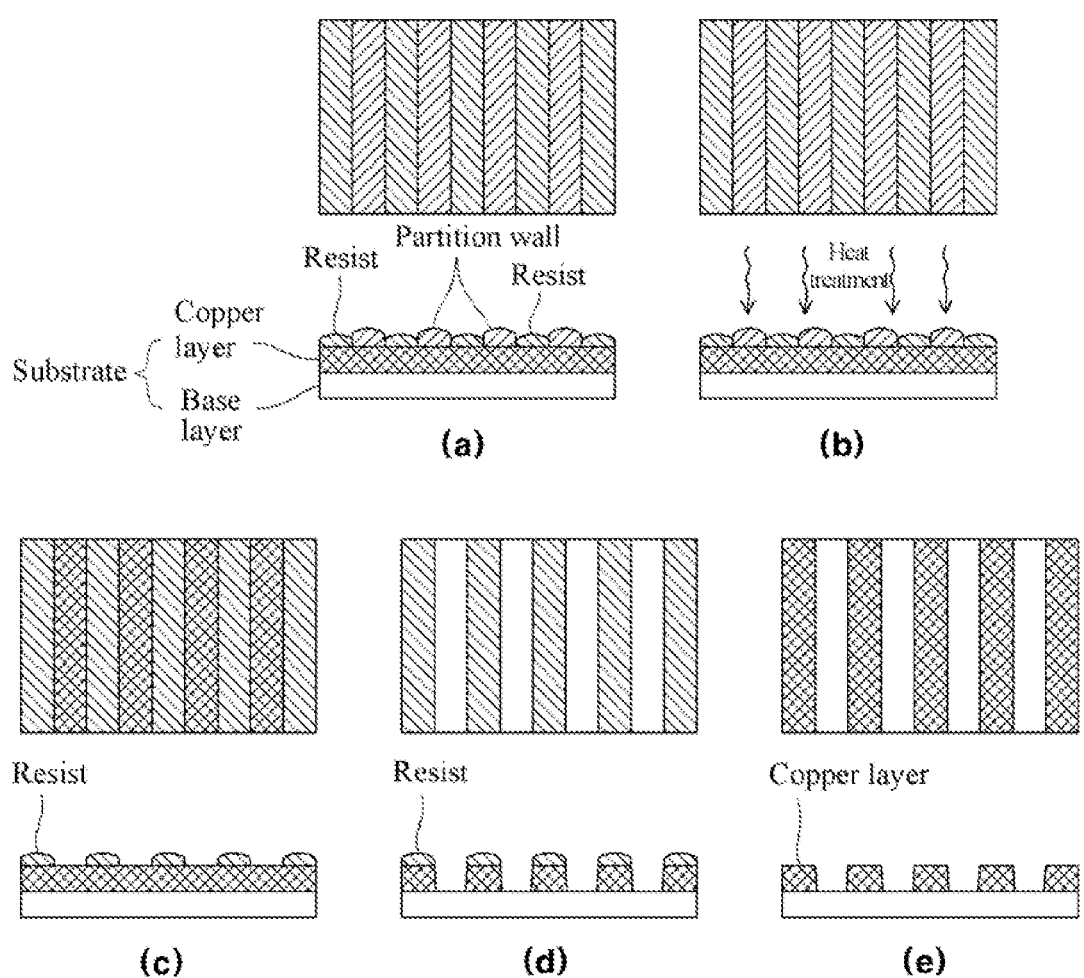
FIG. 2 is a flowchart illustrating a sequence of the method for forming the resist fine pattern according to an embodiment of the present invention.

The present invention may be carried out in various embodiments without departing from the technical ideas or primary features. Therefore, embodiments of the present invention are merely illustrative, but should not be limitedly interpreted.

It will be understood that although the terms such as 'first' and 'second' are used herein to describe various elements, these elements should not be limited by these terms.

The terms are only used to distinguish one component from other components. For example, a first element referred to as a first element in one embodiment can be referred to as a second element in another embodiment without departing from the scope of the appended claims.

As used herein, the term and/or includes any and all combinations of one or more of the associated listed items.

It will also be understood that when an element is referred to as being ""connected to" or "engaged with" another element, it can be directly connected to the other element, or intervening elements may also be present.

It will also be understood that when an element is referred to as being 'directly connected to' another element, there is no intervening elements.

In the following description, the technical terms are used only for explaining a specific exemplary embodiment while not limiting the present invention. The terms of a singular form may include plural forms unless referred to the contrary.

The meaning of 'include' or 'comprise' specifies a property, a number, a step, a process, an element, a component, or a combination thereof in the specification but does not exclude other properties, numbers, steps, processes, elements, components, or combinations thereof.

Unless terms used in the present disclosure are defined differently, the terms may be construed as meaning known to those skilled in the art.

Terms such as terms that are generally used and have been in dictionaries should be construed as having meanings matched with contextual meanings in the art. In this description, unless defined clearly, terms are not ideally, excessively construed as formal meanings.

Hereinafter, embodiments disclosed in this specification is described with reference to the accompanying drawings, and the same or corresponding components are given with the same drawing number regardless of reference number, and their duplicated description will be omitted.

Moreover, detailed descriptions related to well-known functions or configurations will be ruled out in order not to unnecessarily obscure subject matters of the present invention.

A method for forming a resist fine pattern (hereinafter, referred to as a resist fine pattern forming method) according to an embodiment of the present invention forms a fine pattern along an inkjet printing path of a substrate on which a fine pattern is to be formed, and particularly, forms a resist fine pattern on a substrate having the same surface energy by using inkjet printing of printing an ink along a path.

The resist fine pattern forming method according to an embodiment of the present invention includes an ejecting process. As illustrated in FIG. 1, the ejecting process simultaneously discharges a photocurable resist ink and an ink for forming a partition wall (hereinafter, referred to as a partition-forming ink) at a front side and a rear side of the path, respectively, to be spaced apart from each other and applies optical energy to the discharged photocurable resist ink.

The photocurable resist ink may be made of an ink that is cured by light, and the partition-forming ink may be made of an ink that is removable by cleaning with water.

Specifically, as illustrated in FIG. 1, the ejecting process simultaneously performs all of discharging the photocurable resist ink through a first discharge head 100 at a front side of a printing path, discharging the partition-forming ink through a second discharge head 200 at a rear side of the printing path, and applying optical energy through a light irradiator 300 to the discharged photocurable resist ink.

Here, a plurality of nozzles n1 of the first discharge head 100 and a plurality of nozzles n2 of the second discharge head 200 are alternately arranged based on the path, and particularly, alternately arranged to have a difference as many as a half of a resolution pitch to be printed.

Particularly, in the ejecting process, a intensity of light of the optical energy is set so that the photocurable resist ink in a semi-cured and gelatinous state is ejected on the substrate to form a vertical boundary with the partition-forming ink ejected on the substrate and simultaneously prevent the photocurable resist ink from being spread, and the photocurable ink is completely cured after all of the photocurable ink and the volatile ink are completely ejected.

Also, as the partition-forming ink is ejected before the photocurable resist ink is ejected on the substrate and completely spread to prevent the photocurable ink from being spread, an effect of reducing an area on which the photocurable resist ink is ejected is generated.

That is, as the optical energy applied to the discharged photocurable resist ink is set as described above, the partition-forming ink may be ejected between the photocurable resist inks before the photocurable resist ink in the semi-cured and gelatinous state instead of in the completely cured state is ejected and spread on the substrate to prevent the photocurable resist ink from being completely spread, and a boundary between the two inks may be vertically formed.

As described above, as the partition-forming ink is ejected between the photocurable resist inks before the photocurable resist ink is completely spread on the substrate, the vertical boundary between the gelatinous photocurable resist ink and the partition-forming ink may be formed (refer to (a) of FIG. 2), and the gelatinous photocurable resist ink may have a great thickness in both sides of a width direction thereof.

For example, when only the photocurable resist ink is discharged to form a resist fine pattern, as the photocurable resist ink is ejected on the substrate and then gradually spread, a thickness in both sides of the width direction of a pattern made of the photocurable resist ink gradually decreases, and the pattern may have a shape vulnerable to etching.

On the other hand, as illustrated in (a) of FIG. 2, when a resist fine pattern is formed by the method of the present invention, each of both sides of a width direction of a pattern made of the photocurable resist ink may have a great thickness to be almost vertical, and the pattern may be effectively prevented from being etched.

Also, as the ejected photocurable resist ink in the gelatinous state is prevented from being completely spread, the width of the resist fine pattern may be further micronized.

Although the method of discharging the photocurable resist ink through the first discharge head 100 at the front side of the printing path and discharging the partition-forming ink through the second discharge head 200 at the rear side of the printing path is exemplarily described, a method of discharging the partition-forming ink through the first discharge head 100 at the front side of the printing path and discharging the photocurable resist ink through the second discharge head 200 at the rear side of the printing path is not excluded.

That is, one of the photocurable resist ink and the partition-forming ink may be discharged at the front side of the path, and the other thereof may be discharged at the rear side of the path.

As described above, the ejecting process, which corresponds to (a) of FIG. 2, of applying the optical energy to the discharged photocurable resist ink while simultaneously discharging the photocurable resist ink and the partition-forming ink at the front side and the rear side of the path, respectively, to be spaced apart from each other may be performed and then processes illustrated in (b), (c), (d), and (e) of FIG. 2 may be sequentially performed.

Specifically, as illustrated in (b) of FIG. 2, a curing process of additionally curing the photocurable resist ink may be performed after the ejecting process.

Here, the additionally curing of the photocurable resist ink may be performed by a separate photocuring device (a UV curing device), and the partition-forming ink is not additionally cured because the partition-forming ink is not affected by the photocuring device (the UV curing device).

Through the above-described curing process, the further strong resist fine pattern may be formed by the additional curing of the photocuring resist ink.

Also, the thickness of the resist fine pattern may be increased by repeatedly performing the ejecting process at least two times before or after the curing process.

That is, the curing process may be performed after the ejecting process is repeatedly performed at least two times, and one set of the ejecting process and the curing process may be performed two times or more.

Through the above-described process, the resist fine pattern having a desired thickness may be formed.

After the curing process, a cleaning process of cleaning and removing the partition-forming ink with water and an etching process of etching an area of the substrate except for a resist made of the photocurable resist ink are performed.

Specifically, as illustrated in FIG. 2, (a) the ejecting process and (b) the curing process may be performed and then (c) the cleaning process and (d) the etching process may be sequentially performed. When the resist fine pattern is removed after the above-described processes, a fine pattern may be formed on the substrate as illustrated in (e) of FIG. 2.

After the etching process, a desired conductive pattern may be formed, and then the fine pattern may be removed through a strip process. A general stripping solution is an alkali-based solution that does not affect an etching or plating pattern. The resist fine pattern is removed in the form of a film or removed by being melt in the alkali-based solution according to a result of stripping. Constituents of the stripping solution is changed according to that of the resist. After removing the resist, the stripping solution is removed by performing the cleaning process, and a drying process is performed. An ultrasonic wave may be applied together to improve a performance of the stripping and the cleaning.

Another embodiment of the present invention may further include, after the curing process, a cleaning process of cleaning and removing the partition-forming ink with water, a hydrophilic treatment process of performing a hydrophilic treatment on the resist made of the photocurable resist ink, which is remained after the cleaning process, and a plating process of forming a plating pattern on an area of the substrate except for the resist.

Figure 3:
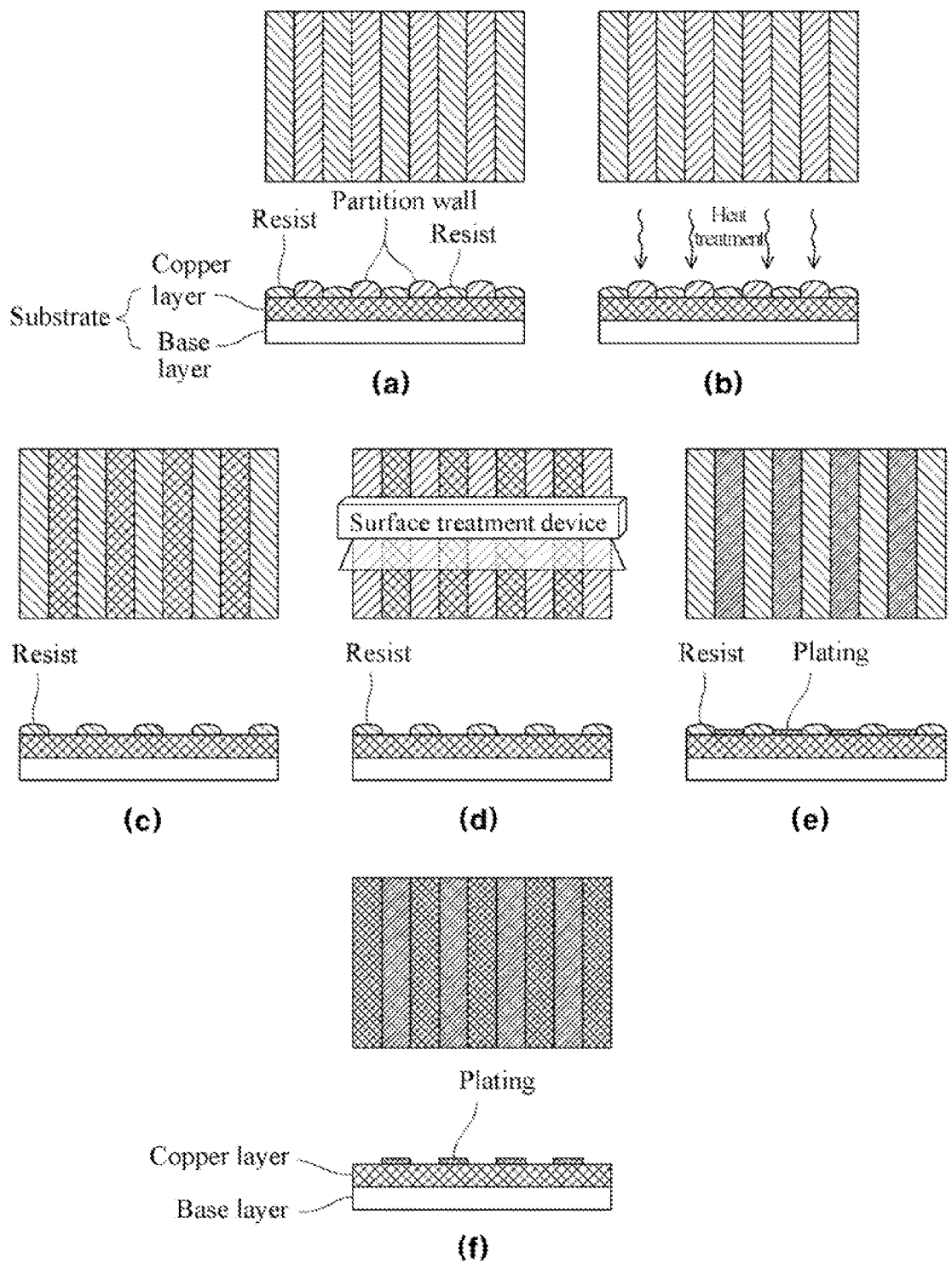
FIG. 3 is a flowchart illustrating a sequence of a method for forming a resist fine pattern according to another embodiment of the present invention.

Specifically, as illustrated in FIG. 3, (a) the ejecting process and (b) the curing process may be performed and then (c) the cleaning process, (d) the hydrophilic treatment process, and (e) the plating process may be sequentially performed. When the resist fine pattern is removed after the above-described processes, a fine pattern may be formed on the substrate as illustrated in (f) of FIG. 3.

Figure 4:
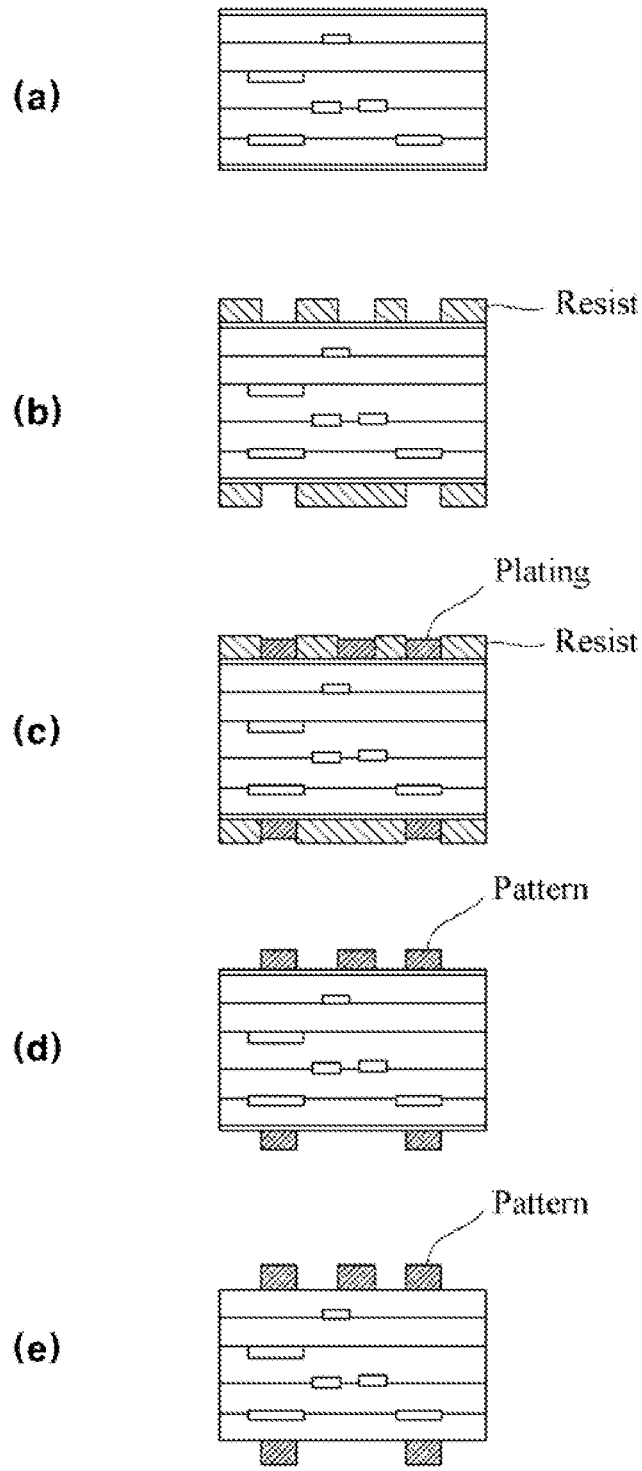
FIG. 4 is a flowchart illustrating a sequence of a method for forming a resist fine pattern according to another embodiment of the present invention.

Also, a pattern of a multilayer PCB substrate illustrated in FIG. 4 may be formed by applying the ejecting process, the curing process, the cleaning process, the hydrophilic treatment process, and the plating process, which are described above.

Specifically, the pattern of the multilayer PCB substrate may be processed as in (b) of FIG. 4 by performing the ejecting process, the curing process, and the cleaning process on top and bottom surfaces of the multilayer PCB substrate formed as illustrated in (a) of FIG. 4, processed as in (c) of FIG. 4 by performing the hydrophilic treatment process and the plating process, processed as in (d) of FIG. 4 by removing the resist fine pattern, and then processed as in (e) of FIG. 4 by performing flash etching.

Disclosed is an apparatus for forming a resist fine pattern (hereinafter, referred to as a resist fine pattern forming apparatus) for performing the above-described resist fine pattern forming method according to an embodiment of the present invention.

The resist fine pattern forming apparatus according to an embodiment of the present invention forms the resist fine pattern on a substrate having the same surface energy by using inkjet printing of printing an ink along a path.

Figure 5:
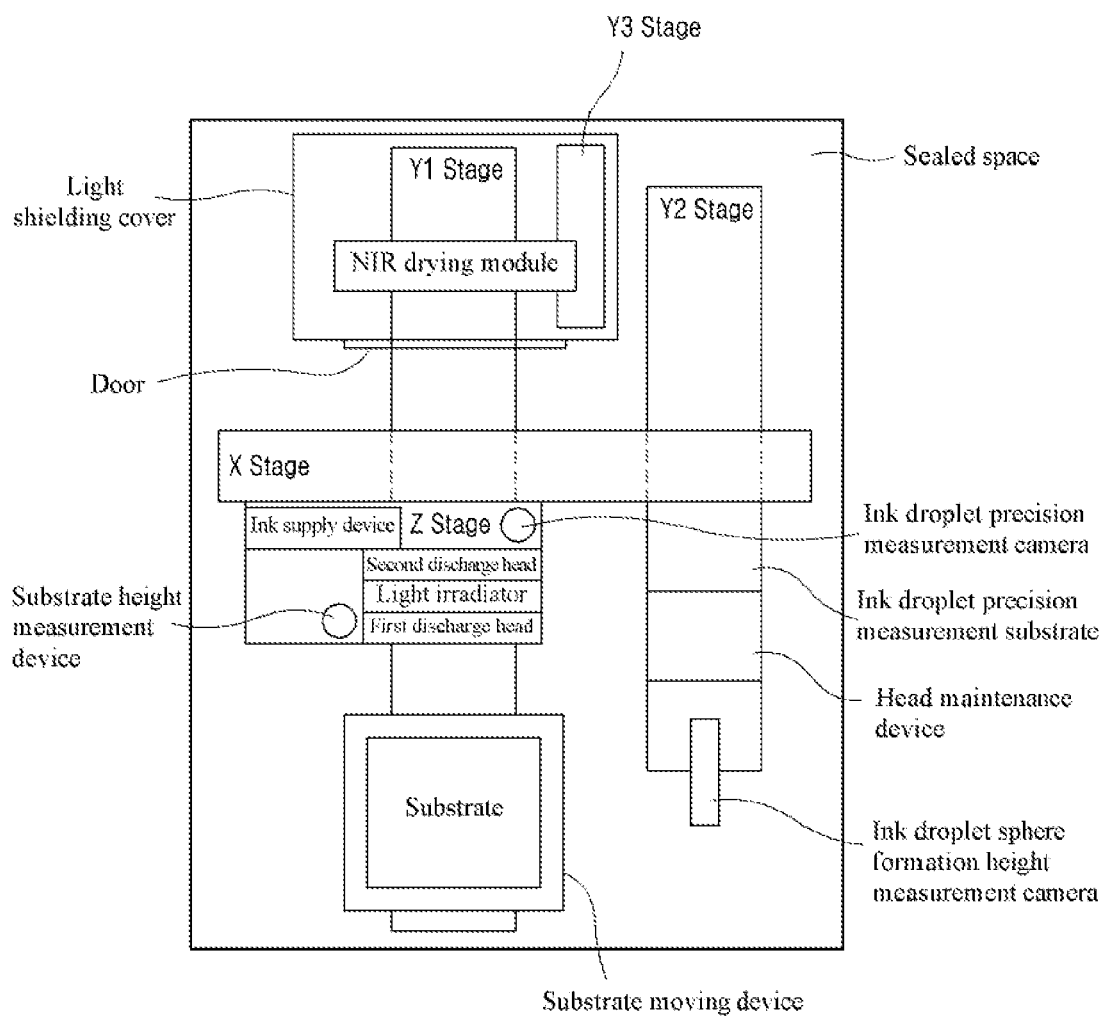
FIG. 5 is a schematic view illustrating an apparatus for forming a resist fine pattern according to an embodiment of the present invention.

As illustrated in FIGS. 1 and 5, the resist fine pattern formation apparatus includes a first discharge head 100 for discharging a first ink at a front side of the path, a second discharge head 200 disposed at a rear side of the path for simultaneously discharging a second ink, and a light irradiator 300 for applying optical energy to the ink discharged from at least one of the first discharge head 100 and the second discharge head 200.

The first ink is one of the photocurable resist ink and the partition-forming ink, and the second ink is the other thereof.

That is, when the first ink is the photocurable resist ink, the second ink is the partition-forming ink, and when the first ink is the partition-forming ink, the second ink is the photocurable resist ink.

Also, an intensity of light of the light irradiator 300 is set so that the photocurable resist ink in a semi-cured and gelatinous state is ejected on the substrate to form a vertical boundary with the partition-forming ink ejected on the substrate and simultaneously prevent the photocurable resist ink from being spread, thereby being completely cured after all of the photocurable resist ink and the partition-forming ink are completely ejected.

FIGS. 5 to 8 are schematic views illustrating resist fine pattern formation apparatuses according to an embodiment of the present invention. Hereinafter, each of four types of resist fine pattern formation apparatuses will be described.

In the four types of resist fine pattern formation apparatuses, head arrangements and positions and number of light irradiators are varied according to a unidirectional or bidirectional printing method and whether the same type ink or different type inks are applied to a first ink and a second ink.

Firstly, a resist fine pattern formation apparatus according to a first embodiment in FIG. 5, which has the unidirectional printing method and uses different type inks, includes a first discharge head for discharging a photocurable resist ink that is cured by an ultraviolet light (UV) curing method, in which the photocurable resist ink that is traveling after being discharged is directly gelled by a light irradiator, and a second discharge head for discharging a solvent or water-based partition-forming ink between patterns made of the photocurable resist ink to form a temporary partition wall.

Specifically, the resist fine pattern formation apparatus according to the first embodiment, which form a resist fine pattern on a substrate having the same surface energy by using an inkjet printing method of jetting an ink along a printing path, include the first discharge head, the second discharge head, and the light irradiator.

As illustrated in FIG. 5, the resist fine pattern formation apparatus includes a substrate moving device for moving a substrate to form a resist fine pattern thereon, a first discharge head for discharging a first ink at a front side of a movement path of the substrate, a light irradiator disposed directly behind the first discharge head, and a second discharge head disposed at a rear side of the movement path of the substrate to discharge a second ink.

In this embodiment, a case in which the first ink is the photocurable resist ink, and the second ink is the partition-forming ink will be exemplarily described.

The first discharge head, the light irradiator, and the second discharge head are directly adjacent to each other in order.

Particularly, an intensity of optical energy of the light irradiator is set so that the gelatinous photocurable resist ink discharged that is from the first discharge head is traveling and is ejected on the substrate to form a vertical boundary with the partition-forming ink that is discharged from the second discharge head and ejected on the substrate and simultaneously prevent the photocurable resist ink from being spread, thereby being cured after all of the photocurable resist ink and the partition-forming ink are completely ejected.

Specifically, the partition-forming ink is discharged from the second discharge head before the photocurable resist ink discharged from the first discharge head is ejected on the substrate and completely cured. Thus, as the partition-forming ink is ejected before the photocurable resist ink is ejected on the substrate and completely spread to prevent the photocurable resist ink from being spread, an area on which the photocurable resist ink is ejected may be reduced, and an edge in a width direction of the photocurable resist ink may be vertically formed.

Also, each of the first discharge head and the second discharge head has a length enough to cover an entire width of the substrate to form a pattern over an entire area of the substrate by performing one printing process on the substrate.

Here, the first discharge head and the second discharge head have the same length and are arranged in serial in front and rear directions of the path.

Specifically, as illustrated in FIG. 1, the first discharge head 100 may include a plurality of nozzles n1 arranged in a direction perpendicular to the path and discharge a photocurable resist ink droplet having a volume of 2 picoliters (pL) or less onto the substrate. Alternatively, the first discharge head 100 may discharge a photocurable resist ink droplet having a volume of 0.6 pL or less according to an inkjet discharge atmosphere (a helium gas atmosphere). The second discharge head 200 may include a plurality of nozzles n2 arranged in a direction perpendicular to the path and discharge a partition-forming ink droplet having a volume of 2 pL or less onto the substrate. Alternatively, the second discharge head 200 may discharge a partition-forming ink droplet having a volume of 0.6 pL or less according to an inkjet discharge atmosphere (a helium gas atmosphere). Here, the plurality of nozzles n1 of the first discharge head 100 and the plurality of nozzles n2 of the second discharge head 200 are alternately arranged based on the path, and particularly, alternately arranged to have a difference as many as a half of a resolution pitch to be printed. Here, an outermost nozzle n2 of the second discharge head 200 is disposed at an inner side of an outermost nozzle n1 of the first discharge head 100 from which the photocurable ink is discharged so that the photocurable resist ink is discharged onto four edges of the substrate to prevent the partition-forming ink discharged from the second discharge head 200 from flowing to the outside of the substrate.

Here, an area on which the photocurable resist ink is discharged may include a plurality of linear areas that are spaced apart from each other, and an on which the partition-forming ink is discharged may include linear areas between the areas on which the photocurable resist ink is discharged.

As illustrated in FIG. 1, the substrate moving device performs a linear movement (an upward movement in the drawing) of the substrate along an Y1 stage.

An ink droplet precision measurement camera and a substrate height measurement device in addition to the first discharge head 100, the second discharge head 200, and the light irradiator 300 are installed on a Z stage that vertically moves to move together, and the Z stage moves linearly along a X stage.

The vertical movement of the Z stage and the movement of the Z stage along the X-stage may be performed by a driving unit such as a linear motor and a linear guide.

As described above, the first discharge head 100, the second discharge head 200, and the light irradiator 300 are assembled to the Z stage and move together by one driving unit.

An Y2 stage is disposed next to and parallel to the Y1 stage, and an ink droplet precision measurement substrate for measuring a precision of an ink droplet discharged from each of the first discharge head and the second discharge head is disposed on the Y2 stage.

Also, a head maintenance device for maintaining the first discharge head and the second discharge head is disposed on the Y2 stage.

Also, an ink droplet sphere formation height measurement camera for measuring a sphere formation height of an ink droplet discharged from each of the first discharge head and the second discharge head is disposed on the Y2 stage.

All of the ink droplet precision measurement substrate, the head maintenance device, and the ink droplet sphere formation height measurement camera are assembled into one body to linearly move along the Y2 stage.

Also, a NIR drying module (or a pulsed UV curing module) may be installed at a rear side of the Y1 stage for speed and convenience of a process of drying the substrate moving along the Y1 stage and to quickly perform a printing process of the partition-forming ink a plurality of times.

The NIR drying module may be installed in a box-shaped light shielding cover having a door at one side thereof and linearly move along an Y3 stage disposed in the light shielding cover.

The above-described inkjet printing device may be installed in a sealed space having a helium gas atmosphere, and a process of discharging the photocurable resist ink from the first discharge head and a process of discharging the partition-forming ink from the second discharge head may be performed under the helium gas atmosphere.

The inkjet printing device is installed in the sealed space having the helium gas atmosphere in order to inkjet-discharge the photocurable resist ink in the form of an ink droplet having a smaller size and inkjet-discharge the partition-forming ink in the form of an ink droplet having a smaller size.

Specifically, since helium has a density (0.1785 kg/m3) that is about 15% of a density (1.2 kg/m3) of air, a terminal velocity of the ink droplet may be improved. More specifically, the helium atmosphere may reduce air (gas) resistance to maintain a sufficient discharge speed and a sufficient traveling distance due to a low molecular weight of the helium although an ink droplet having a volume of 0.6 pL or less is discharged.

Figure 6:
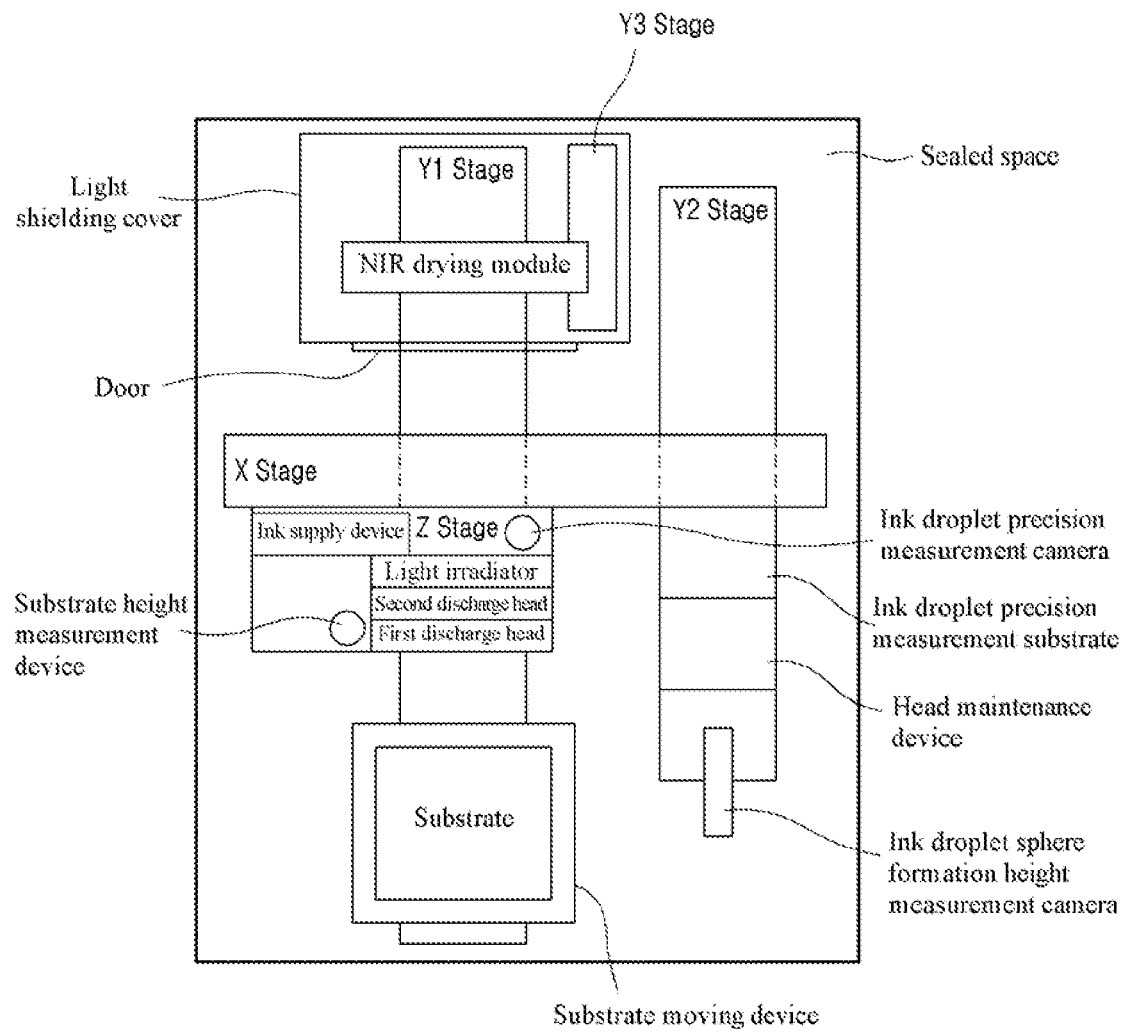
FIG. 6 is a schematic view illustrating an apparatus for forming a resist fine pattern according to another embodiment of the present invention.

Next, a resist fine pattern forming apparatus according to a second embodiment in FIG. 6, which has the unidirectional printing method and uses the same type ink, includes a first discharge head for discharging a photocurable resist ink that is cured by the UV curing method, a second discharge head for discharging a water soluble partition-forming ink between patterns made of the photocurable resist ink, and a light irradiator for gelling all of the two above-described inks.

Specifically, the first discharge head, the second discharge head, and the light irradiator are directly adjacent to each other in order.

The light irradiator irradiates, with light, the inks discharged from the first discharge head and the second discharge head to gel all of the inks discharged from the first discharge head and the second discharge head.

Figure 7:
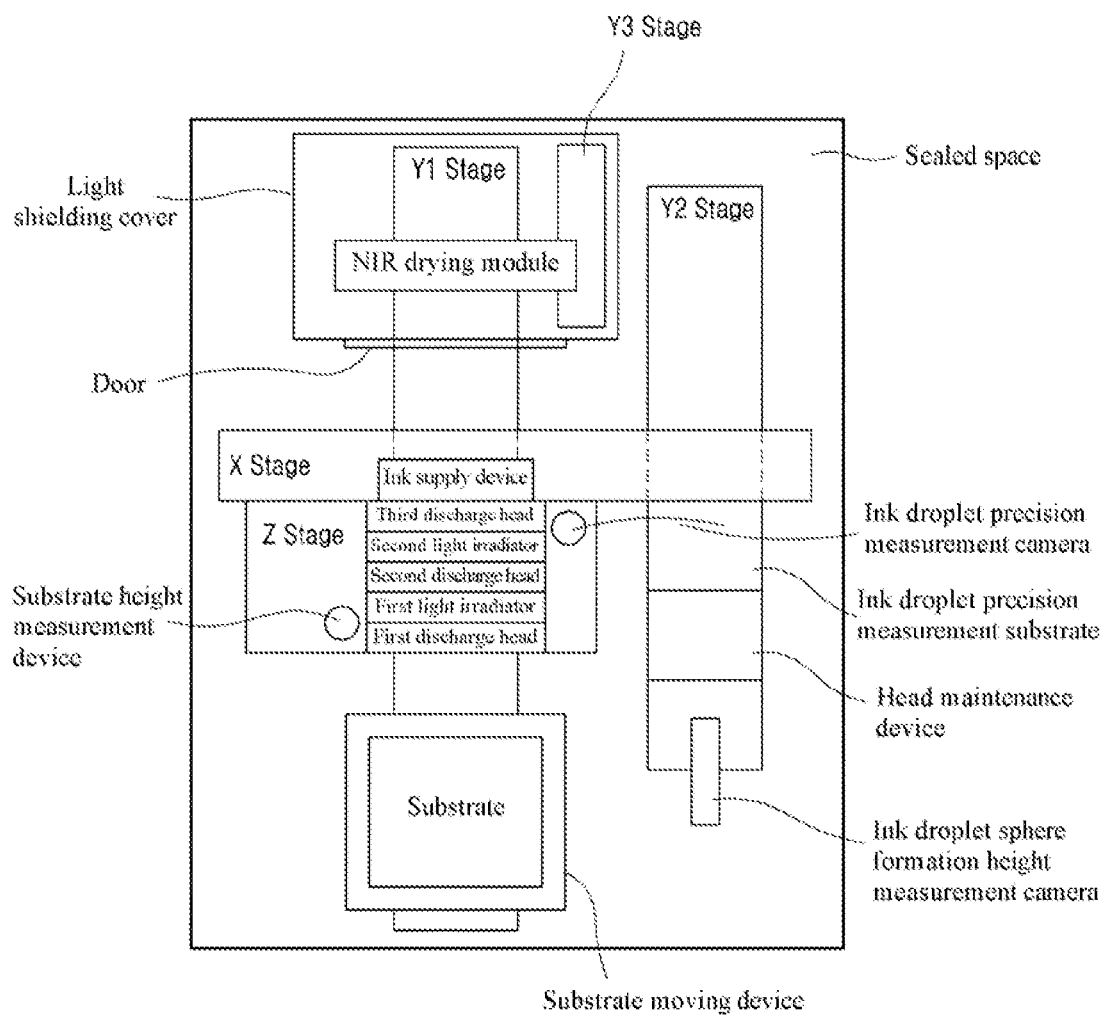
FIG. 7 is a schematic view illustrating an apparatus for forming a resist fine pattern according to another embodiment of the present invention.

Next, a resist fine pattern forming apparatus according to a third embodiment in FIG. 7, which has the bidirectional printing method and uses the different type inks, includes a first discharge head, a first light irradiator, a second discharge had, a second light irradiator, and a third discharge head, which are arranged in series in order.

Each of the first discharge head and the third discharge head discharges a photocurable resist ink that is cured by the UV curing method, the second discharge head discharges a solvent or water-based partition-forming ink, the first light irradiator disposed adjacent to the first discharge head irradiates, with light, the ink discharged from the first discharge head, and the second light irradiator disposed adjacent to the third discharge head irradiates, with light, the ink discharged from the third discharge head.

The first discharge head, the first light irradiator adjacent to the first discharge head, and the second discharge head are operated for forward printing (the substrate moves upward in FIG. 7), and the third discharge head, the second light irradiator adjacent to the third discharge head, and the second discharge head are operated for reverse printing (the substrate moves downward in FIG. 7).

Figure 8:
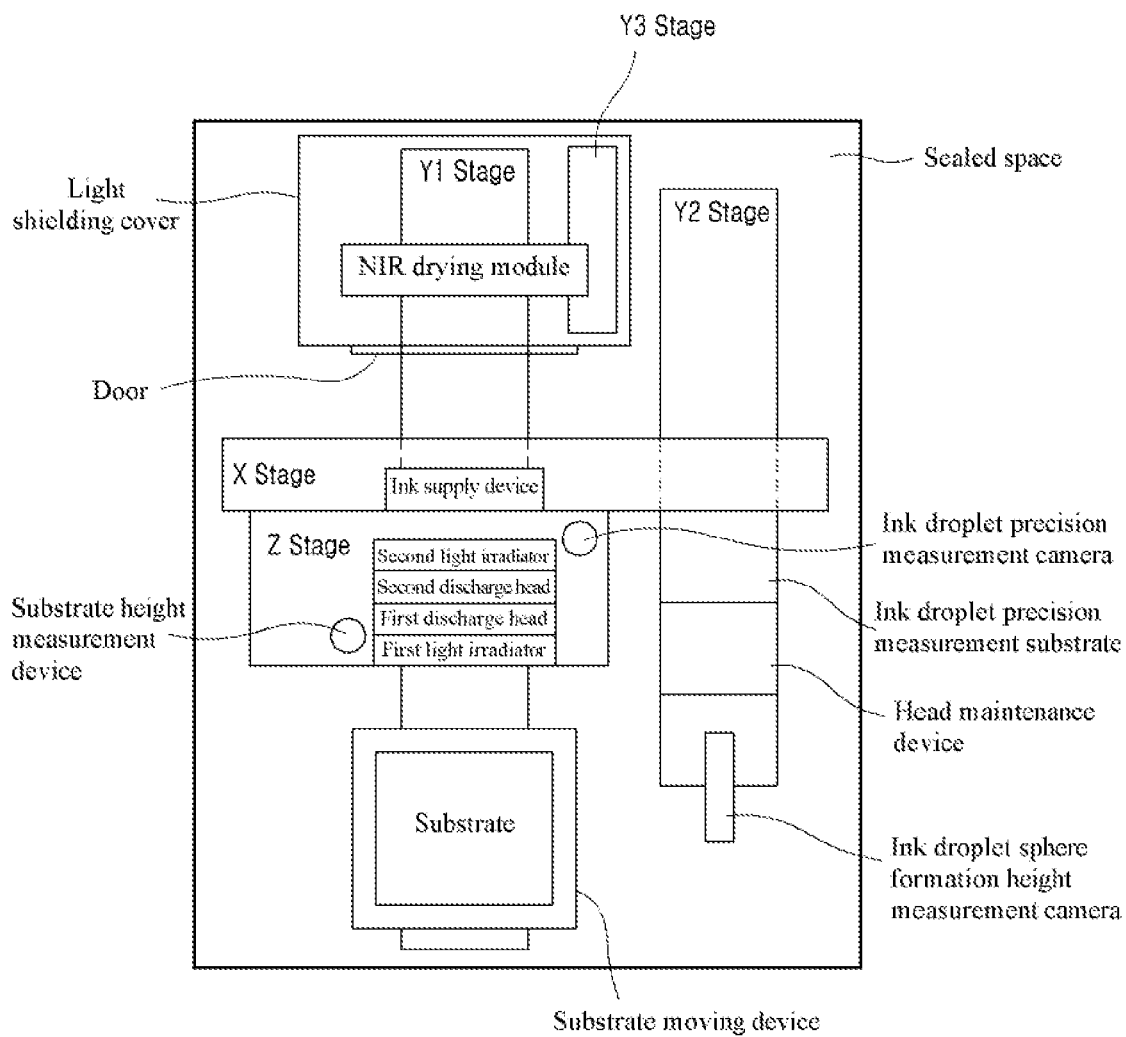
FIG. 8 is a schematic view illustrating an apparatus for forming a resist fine pattern according to another embodiment of the present invention.

Next, a resist fine pattern forming apparatus according to a fourth embodiment in FIG. 8, which has the bidirectional printing method and uses the same type ink, includes a first light irradiator, a first discharge head, a second discharge head, and a second light irradiator, which are arranged in series in order.

The first discharge head discharges a photocurable resist ink that is cured by the UV curing method, and the second discharge head discharges a water soluble partition-forming ink between patterns made of the photocurable resist ink.

The first discharge head, the second discharge head, and the second light irradiator are operated for forward printing (the substrate moves upward in FIG. 8), and the second discharge head, the first discharge head, and the first light irradiator are operated for reverse printing (the substrate moves downward in FIG. 8).

Although the embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A method for forming a resist fine pattern, which forms a resist fine pattern on a substrate by using an inkjet printing method of printing an ink along a path, the method comprising:
    an ejecting process of, while simultaneously discharging a photocurable resist ink at a front side of the path and a partition-forming ink at a rear side of the path to be spaced apart from each other, applying optical energy to the discharged photocurable resist ink,
    wherein an intensity of light of the optical energy is set so that the photocurable resist ink is semi-cured and deposited on the substrate in a gelatinous state to form a vertical boundary with the partition-forming ink deposited on the substrate and simultaneously prevent the photocurable resist ink from being spread, thereby being cured after all of the photocurable resist ink and the partition-forming ink are completely deposited.

2. The method of claim 1, wherein one of the photocurable resist ink and the partition-forming ink is discharged at the front side of the path, and the other thereof is discharged at the rear side of the path.

3. The method of claim 1, further comprising a curing process of additionally curing the photocurable resist ink after the ejecting process.

4. The method of claim 1, wherein the ejecting process is performed at least two times to thicken a thickness of the resist fine pattern.

5. The method of claim 1, wherein the photocurable resist ink is discharged through a plurality of nozzles of a first discharge head, which are arranged in a direction perpendicular to the path,
    the partition-forming ink is discharged through a plurality of nozzles of a second discharge head, which are arranged in a direction perpendicular to the path, and
    the plurality of nozzles of the first discharge head and the plurality of nozzles of the second discharge head are alternately arranged based on the path.

6. The method of claim 5, wherein the plurality of nozzles of the first discharge head and the plurality of nozzles of the second discharge head are alternately arranged so that an outermost nozzle of the second discharge head is disposed at an inner side of an outmost nozzle of the first discharge head.

7. The method of claim 5, wherein the first discharge head and the second discharge head have the same width that covers an entire width of the substrate and are arranged in series in front and rear directions of the path.

8. The method of claim 1, wherein the partition-forming ink is removable by cleaning with water.

9. A method for forming a resist fine pattern, which forms a resist fine pattern on a substrate by using an inkjet printing method of printing an ink along a path, the method comprising:
    an ejecting process of, while simultaneously discharging a photocurable resist ink at a front side of the path and a partition-forming ink at a rear side of the path to be spaced apart from each other, applying optical energy to the discharged photocurable resist ink, wherein an intensity of light of the optical energy is set so that the photocurable resist ink is semi-cured and deposited on the substrate in a gelatinous state to form a vertical boundary with the partition-forming ink deposited on the substrate and simultaneously prevent the photocurable resist ink from being spread, thereby being cured after all of the photocurable resist ink and the partition-forming ink are completely deposited;
    after the ejecting process, a cleaning process of removing the partition-forming ink by cleaning with water; and
    an etching process of etching an area of the substrate except for a resist made of the photocurable resist ink, which is remained after the cleaning process.

10. The method of claim 1, further comprising: after the ejecting process,
    a cleaning process of removing the partition-forming ink by cleaning with water;
    a hydrophilic treatment process of performing hydrophilic treatment on a resist made of the photocurable resist ink, which is remained after the cleaning process; and
    a plating process of forming a plating pattern on an area of the substrate except for the resist.

11. An apparatus for forming a resist fine pattern, which forms a resist fine pattern on a substrate having the same surface energy by using an inkjet printing method of printing an ink along a path, the apparatus comprising:
- a first discharge head configured to discharge a first ink at a front side of the path;
- a second discharge head configured to discharge a second ink at a rear side of the path at the same time with the first discharge head; and
- a light irradiator configured to apply optical energy to the ink discharged from at least one of the first discharge head and the second discharge head,
- wherein the first ink is one of a photocurable resist ink and a partition-forming ink, and the second ink is the other thereof,
- an intensity of light of the light irradiator is set so that the photocurable resist ink in a is semi-cured and deposited on the substrate in a gelatinous state to form a vertical boundary with the partition-forming ink deposited on the substrate and simultaneously prevent the photocurable resist ink from being spread, thereby being cured after all of the photocurable resist ink and the partition-forming ink are completely deposited.

12. The apparatus of claim 11, wherein the photocurable resist ink is discharged through a plurality of nozzles of the first discharge head, which area arranged in a direction perpendicular to the path,
- the partition-forming ink is discharged through a plurality of nozzles of the second discharge head, which area arranged in a direction perpendicular to the path, and
- the plurality of nozzles of the first discharge head and the plurality of nozzles of the second discharge head are alternately arranged based on the path.

13. The apparatus of claim 12, wherein the plurality of nozzles of the first discharge head and the plurality of nozzles of the second discharge head are alternately arranged so that an outermost nozzle of the second discharge head is disposed at an inner side of an outmost nozzle of the first discharge head.

14. The apparatus of claim 12, wherein the first discharge head and the second discharge head have the same width that covers an entire width of the substrate and are arranged in series in front and rear directions of the path.

* * * * *